United States Patent [19]

Kirkpatrick

[11] 3,784,840

[45] Jan. 8, 1974

[54] SOLID STATE REMOTE POWER SWITCH

[75] Inventor: Richard A. Kirkpatrick, Peabody, Mass.

[73] Assignee: KLH Research & Development Corp., Cambridge, Mass.

[22] Filed: Dec. 21, 1972

[21] Appl. No.: 317,240

[52] U.S. Cl. .................................. 307/11, 307/248

[51] Int. Cl. .......................................... H03k 17/00

[58] Field of Search ...................... 307/248, 38, 114, 307/115, 140, 143, 11; 328/9

[56] References Cited

UNITED STATES PATENTS

| | | | |
|---|---|---|---|
| 3,421,063 | 1/1969 | Reinke | 307/38 |
| 3,544,720 | 1/1970 | Corderman | 307/248 |

*Primary Examiner*—Herman J. Hohauser
*Attorney*—Robert Scobey et al.

[57] ABSTRACT

A solid state remote power switch is provided, e.g., in an amplifier system having a remotely located phonograph turntable or tape deck. Turning on the phonograph turntable or tape deck ensures that the amplifier is energized at the same time. When the phonograph turntable or tape deck turns off it simultaneously removes power from the amplifier. The solid state remote power switch includes a semiconductor bidirectional current passing device of the triac type coupled in series between the AC power source and the energization circuitry of the amplifier unit. The phonograph turntable or tape deck is adapted to be connected to the amplifier unit and, when turned on, provides the control signal which activates or turns on the triac device, thereby simultaneously providing power to the amplifier unit.

6 Claims, 3 Drawing Figures

SOLID STATE REMOTE POWER SWITCH

BACKGROUND AND BRIEF DESCRIPTION OF THE INVENTION

This invention relates to remote power switches and, in particular, to a solid state device utilized to activate one electrically powered unit in accordance with the activation of another electrically powered unit.

At the present time, many hi-fi systems are fabricated in several separate units which are interconnected to form a complete system in contrast to the large console systems heretofore popular. Frequently, an auxiliary unit such as a tape recorder, phonograph turntable or other auxiliary piece of equipment, is used in combination with the amplifier unit and is remotely located therefrom. It is desirable to control the energization of the amplifier in accordance with the tape deck or turntable, e.g., so that the amplifier is automatically switched on and off in accordance with the operation of the turntable or tape deck. Prior art systems accomplish this function with relatively expensive and unreliable and slow relays or thermally operated switches. The present invention provides a means for activating (and deactivating) the amplifier unit simultaneously with the activation (and deactivation) of auxiliary equipment without relays. The present invention also provides means for activating the amplifier without activating the auxiliary equipment, if desired. All of this is accomplished with a fast, reliable, relatively inexpensive semiconductor device and circuit arrangement.

The invention involves use of a semiconductor bidirectional current passing device of the triac type having two current passing power electrodes and a current passing control electrode that permits current to flow between the power electrodes when current is flowing through the control electrode. The two power electrodes are coupled to a source of electrical power and control the energization of a first device such as an amplifier, for example. The control electrode is connected in a path that couples the source of electrical power to a second device such as a phonograph turntable or tape deck. In this fashion when the second device is operative and current flows therethrough and through the control electrode, current is permitted to flow between the power electrodes thereby to energize the first device. The first device is accordingly automatically turned on and off in accordance with the on and off operation of the second device. If desired, switches may be employed to bypass the second device so as to provide a current to the control electrode and to energize the first device. Alternatively, the energization of the first device may be independently controlled by a switch that couples the control electrode to one of the power electrodes of the triac.

Representative prior art patents and publications are as follows:

APPLICATION NOTE - "Triac Control for AC Power" by E.K. Howell GENERAL ELECTRIC, Copy in Class 307, Sub-Class 252.B SOURCEBOOK OF ELECTRONIC CIRCUITS, McGraw-Hill 1968, p. 713, "A-C Power Interlock"

U.S. PATENTS

No. 3,603,817 issued 7 Sept. 1971 to C. F. Casson

No. 3,566,198 issued 23 Feb. 1971 to K. B. Delahunty

No. 3,526,790 issued 1 Sept. 1970 to J. L. Brookmire

No. 3,517,217 issued 23 June 1970 to R. G. Sleater et al.

No. 3,496,390 issued 17 Feb. 1970 to G. J. Fischer

No. 3,486,042 issued 23 Dec. 1969 to D. L. Watrous

No. 3,432,740 issued 11 Mar. 1969 to R. E. Morgan

No. 3,418,558 issued 24 Dec. 1968 to R. E. Morgan et al.

No. 3,416,001 issued 10 Dec. 1968 to D. N. Fistell

No. 3,413,486 issued 26 Nov. 1968 to R. A. Flieder et al.

No. 2,717,781 issued 13 Sept. 1955 to C. Reykjalin

DESCRIPTION OF THE PREFERRED EMBODIMENT

Figure 1:
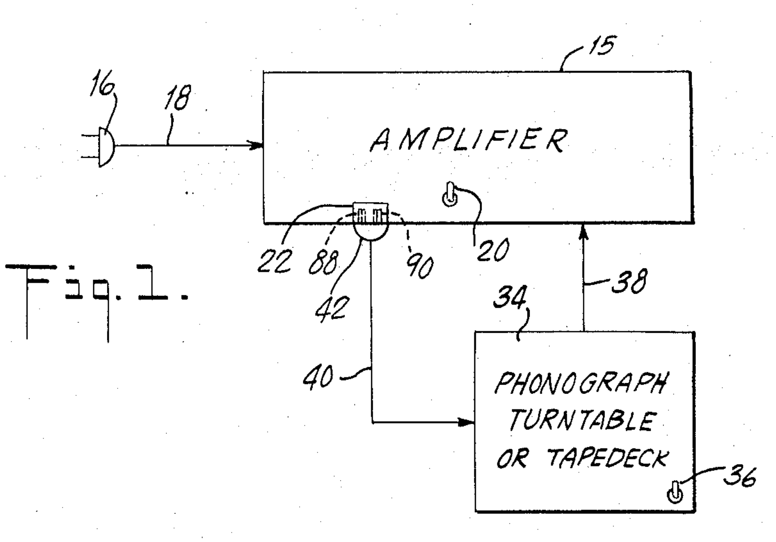
FIG. 1 is a simplified block diagram of a typical system utilizing the principles of the present invention.

Referring now to the drawing and in particular, to FIG. 1, an amplifier 15 is included in the preferred embodiment of the invention. AC power to operate the system is obtained from a conventional electrical wall receptacle, not shown, into which is inserted a plug 16. The plug 16 is connected, via a two wire cable 18, to the amplifier unit 15.

A switch 20 is provided on the amplifier unit 15, and is used to turn on only that unit, if desired. A female receptacle 22 having two prong-receiving sockets 88 and 90 is also provided on the amplifier unit 15. An auxiliary piece of equipment or unit 34, such as a phonograph turntable or tape deck in the preferred embodiment, is provided with an on-off switch 36 which also controls operation of the amplifier 15 as described in detail below. The unit 34 is coupled, in a conventional manner via a cable 38, to the amplifier 15 to provide a signal for amplification. AC power input cable 40 of the phonograph turntable or tape deck 34 contains two conductors and is provided with a conventional male plug 42, which is adapted to mate with receptacle 22 on the amplifier unit 15. Although the preferred embodiment of the invention describes a phonograph turntable or tape deck as an auxiliary piece of equipment to be used with an amplifier system, the present invention is not limited thereto.

It is to be noted that the plug 42, which cooperates with receptacle 22, contains two conducting prongs 102 and 104 which have connected thereto conducting wires or leads 106 and 110 respectively, (shown in FIG. 3), and is adapted to contact or mate with sockets 88 and 90 respectively. The same plug 42 may be inserted into an electrical wall outlet, not shown, and may be used to operate the auxiliary piece of equipment in a conventional manner, if desired.

Figure 2:
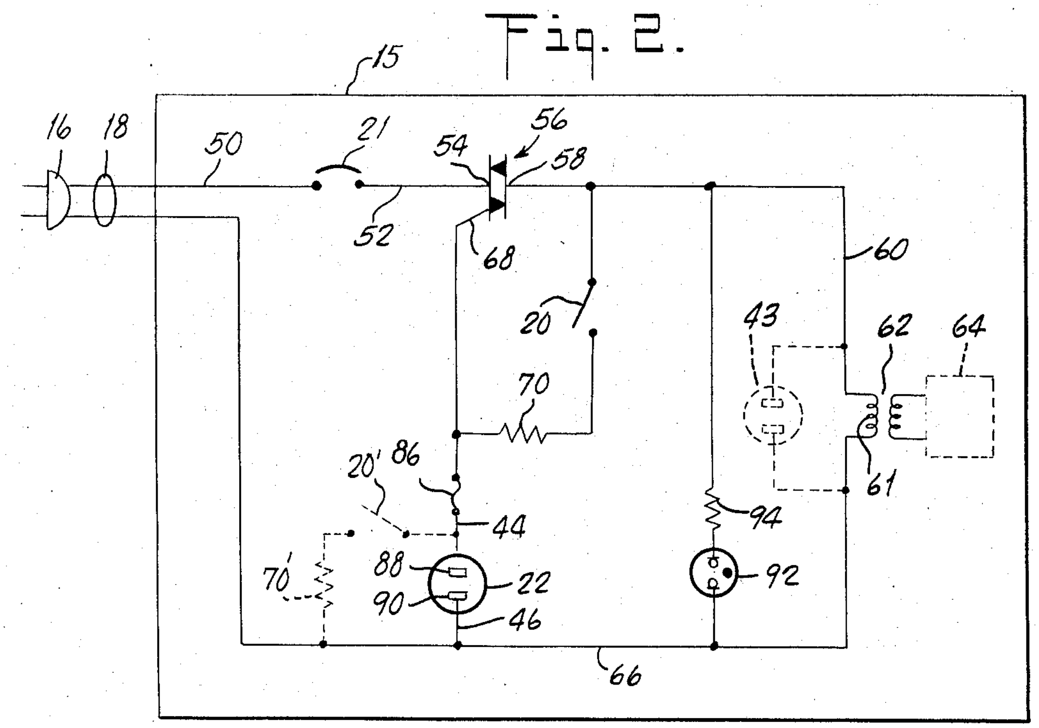
FIG. 2 is a schematic circuit diagram of a portion of the system of FIG. 1.

The schematic circuit diagram of a portion of the amplifier unit 15 is shown in FIG. 2. A circuit breaker 21, for example, shown in the normally closed condition, is provided in one of the AC input power lines for overload protection. One end of switch 21 is connected, via a wire 50 and plug 16, to a wall outlet, not shown. Switch 21 has its other end coupled, via a wire 52 to a power electrode terminal 54 of a semiconductor bidirectional current passing device 56 of the triac type. See the General Electric "APPLICATION NOTE" referenced above for a description of such a device, its operation and typical uses. The other power electrode terminal 58 of triac 56 is coupled, via wire 60, to one end of the primary winding 61 of a power transformer 62, which is part of the conventional energizing circuitry of the amplifier 15 as represented diagrammatically by dotted box 64. The other end of primary winding 61 is coupled, via line 66 and plug 16, to the wall receptacle. The gate electrode terminal 68 of triac 56, sometimes referred to as the control electrode terminal, is coupled, via a resistor 70 and switch 20 to the power electrode 58.

Figure 3:
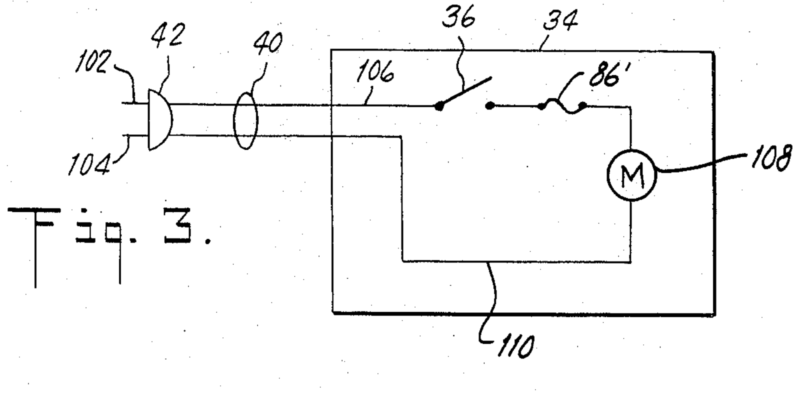
FIG. 3 is a schematic circuit diagram of typical auxiliary equipment forming a part of the system of FIG. 1.

The gate or control electrode 68 is also coupled, via a fuse 86 and a wire 44, to one electrically conducting terminal 88 of the female receptacle 22. The other electrically conducting terminal 90 of receptacle 22 is coupled, via wire 46, wire 66 and plug 16 to the wall receptacle acting as a source of power. The fuse 86, although shown in the preferred embodiment, may be replaced by conducting wire if desired, or may be incorporated as shown in FIG. 3 (fuse 86') in the auxiliary equipment.

A pilot light 92, which is of the gas filled type, is coupled in series with a resistor 94, to the power electrode 58 and is used to indicate when the amplifier unit 15 is activated. If so desired, a circuit constructed according to the principles of the present invention, may include a receptacle 43 such as shown in FIG. 2, for example, provided for energization of a receiver unit, an amplifier unit, etc. The receptacle 43 is energized as is the power transformer 62.

In place of switch 20 and resistor 70, a switch 20' and a resistor 70' may be connected around the receptacle 22 (in parallel with the auxiliary equipment) and may be used to turn the amplifier unit 15 on and off independently of the equipment plugged into receptacle 22. Since this is an alternative method of activating the amplifier unit, it is shown in dashed lines. The preferred method of turning on the amplifier unit without the auxiliary unit is accomplished by the use of switch 20 and resistor 70 which will be explained hereinafter.

An auxiliary unit shown as phonograph or tape deck 34, is provided with plug 42 which contains two conducting terminals 102 and 104, which are connected to wires 106 and 110, respectively. Terminals 102 and 104 of plug 42 are adapted to mate with receptacle terminals 88 and 90. Conducting terminal 102 is connected, via wire 106, switch 36, and fuse 86' to one side of a motor 108. The other side of the motor 108 is connected, via a wire 110 to electrical conducting terminal 104. Although a phonograph turntable or tape deck is shown in the preferred embodiment, the input or energizing circuit of any type of auxiliary equipment may be used to supply the gating current for the triac as noted heretofore.

In operation, the plug 16 is inserted into a conventional wall receptacle, not shown, to provide the AC power to operate the system. The circuit breaker 21 couples one side of the AC line voltage to the triac power electrode 54. The other power electrode 58 is coupled to the primary 61 of the transformer 62. The triac 56 prevents current flow therethrough, since it is in a normally nonconducting or high impedance state. Therefore, it prevents current from flowing to the other side of the AC line, via wire 66. The triac 56 may be placed in its low impedance state (low impedance between power terminals 54 and 58) by providing gating or control current to the gate electrode 68. This is accomplished independtly of the auxiliary equipment by closing switch 20, which provides current, via wire 66, primary winding 61 of transformer 62, switch 20, resistor 70 to the gate electrode 68 of the triac 56. The current flowing into the gate electrode 68 of triac 56 changes the triac to its low impedance state permitting the current to flow into transformer primary winding 61, thereby supplying the necessary energizing current for the amplifier unit 15. The same independent control of the triac may be achieved by closing switch 20' to supply gating current, as noted earlier, via wire 66, resistor 70', switch 20' and fuse 86 to the gate electrode 68. Note that in either of these two conditions the amplifier unit 15 may be activated without auxiliary equipment being connected to socket 22. In this connection it should be noted that current surges are more easily handled by the triac than by mechanical switches 20 or 20'.

In normal operation, the auxiliary equipment plug 42 is mated with the receptacle 22 and the switch 20 (or 20') is left in its open condition. Closing switch 36 provides a current path from one side of the AC input line via plug 16, wire 66, terminal 90 of plug 22, conducting terminal 104 of plug 42, wire 110, motor 108, fuse 86', switch 36, wire 106, conducting terminal 102 of plug 42, terminal 88 of plug 22, wire 44 and fuse 86 to the gate electrode 68. The current drawn by motor 108 is sufficient to energize triac 56, changing it to its low impedance state between terminals 54 and 58, thereby permitting energizing current to flow through transformer primary winding 61. Thus by turning on a remotely located phonograph turntable or tape deck connected to an amplifier unit 15, via its conventional power plug 42, the amplifier unit 15 is simultaneously energized with the remotely located unit.

It is to be noted that turning off the auxiliary equipment will deenergize or turn off the amplifier unit since the triac gating current is no longer supplied.

The operation of the triac is not as simple as described above. During every zero-axis crossing of the instantaneous line voltage, when that triac is controlled by switch 20, the triac does not turn on until the voltage drop across the open triac causes a sufficient current to flow through the resistor 70. The triac then stays "on" regardless of the gate condition until the line voltage again swings through zero. Then a cycle repeats with the opposite polarity of line voltage. When the switch 20 is opened, the triac conducts until the next zero-axis crossing of the instantaneous line voltage, and then it opens.

When operated by means of the auxiliary equipment, such as shown in FIG. 3, rather than by switches 20 or 20', the triac does not conduct until the current of motor 108 (the gate current) rises to a trigger value. The General Electric "Application Note", as noted above, contains a complete description of the operation of the triac.

There has been described a system for controlling the energization of one device in accordance with the energization of another device. Modifications of the representative embodiments disclosed will suggest themselves to those skilled in the art. For example, the triac 56 may be bypassed by a resistor-capacitor combination to supress transients. Further, protective diodes may be provided shunting the control electrode 68 to prevent excessive current from flowing through the control electrode and destroying the triac. However, rugged triacs are available on the market, such as Motorola-type MAC–11–4, which are capable of withstanding relatively high currents. Accordingly, the invention should be taken to be defined by the following claims.

What is claimed is:

1. In a system having first and second electrically operated devices, an improved control circuit for applying electrical power from a source thereof to the first device only when the second device is energized comprising:

a. a semiconductor bidirectional current passing device of the triac type having two current passing power electrodes and a current passing control electrode that permits current to flow between the power electrodes when current is flowing through the control electrode;
b. means for connecting said two power electrodes in a current passing path coupling said source of electrical power to said first device; and
c. means for connecting said control electrode in a current passing path coupling said source of electrical power to said second device so that, when said second device is operative and current flows therethrough and through said control electrode, current is permitted to flow between said power electrodes thereby to energize said first device.

2. A system according to claim 1 including switch means for completing an electrical path around said second device to provide for current flow through said control electrode to energize said first device independently of the flow of current through said second device.

3. A system according to claim 1 including switch means for coupling said control electrode to one of said power electrodes for passing current through said control electrode to energize said first device independently of the passage of current through said second device.

4. A system according to claim 1 in which the means (c) includes an electrical socket on said first device adapted to receive a mating electrical plug for supplying power to said second device.

5. A system according to claim 4 in which said first device comprises an amplifier and said second device comprises one of a phonograph turntable and tape deck.

6. A system useful for applying electrical power from a source thereof to a first electrically operated device only upon the energization of a second electrically operated device, comprising:

a. a semiconductor bidirectional current passing device of the triac type having two current passing power electrodes and a current passing control electrode that permits current to flow between the power electrodes when current is flowing through the control electrode;
b. means for connecting said two power electrodes in a current passing path that couples a source of electrical power to a first electrical socket, said first electrical socket being adapted to receive a first mating electrical plug connected to said first device; and
c. means for connecting said control electrode in a current passing path that couples said source of electrical power to a second electrical socket, said second electrical socket being adapted to receive a second mating electrical plug connected to said second device to supply electrical power thereto.

* * * * *